(12) United States Patent
Shiu et al.

(10) Patent No.: US 7,422,973 B2
(45) Date of Patent: Sep. 9, 2008

(54) METHOD FOR FORMING MULTI-LAYER BUMPS ON A SUBSTRATE

(75) Inventors: Hei Ming Shiu, Tsuen Wan (HK); On Lok Chau, Ma On Shan (HK); Gor Amie Lai, Tseung Kwan (HK)

(73) Assignee: Freescale Semiconductor, Inc., Houston, TX (US)

( * ) Notice: Subject to any disclaimer, the term of this patent is extended or adjusted under 35 U.S.C. 154(b) by 244 days.

(21) Appl. No.: 11/341,302

(22) Filed: Jan. 27, 2006

(65) Prior Publication Data

US 2007/0178688 A1    Aug. 2, 2007

(51) Int. Cl.
    *H01L 21/44* (2006.01)
(52) U.S. Cl. .................. 438/612; 257/E21.508
(58) Field of Classification Search .......... 438/612; 257/E21.508
    See application file for complete search history.

(56) References Cited

U.S. PATENT DOCUMENTS 5,470,787 A    11/1995    Greer

| 5,880,017 A | 3/1999 | Schwiebert et al. |
| 2002/0064930 A1 | 5/2002 | Ishikawa |
| 2005/0141150 A1 * | 6/2005 | Bentley et al. .................. 361/2 |

FOREIGN PATENT DOCUMENTS

| EP | 0 899 786 A2 * | 9/1999 |
| JP | 07153764 A | 6/1995 |
| JP | 2002 076043 A | 3/2002 |

* cited by examiner

*Primary Examiner*—Thao X. Le
*Assistant Examiner*—Elias Ullah
(74) *Attorney, Agent, or Firm*—Charles Bergere

(57) ABSTRACT

A method for forming multi-layer bumps on a substrate includes depositing an adhesive or a flux on the substrate, depositing a first metal powder on the adhesive, and melting or reflowing the adhesive and first metal powder to form first bumps. An adhesive or a flux and a second metal powder are then deposited on the first bumps, and melted to form second bumps on the first bumps to form multi-layer bumps. The multi-layer bumps are formed without the need for any wet chemicals.

18 Claims, 4 Drawing Sheets

METHOD FOR FORMING MULTI-LAYER BUMPS ON A SUBSTRATE

BACKGROUND OF THE INVENTION

The present invention relates to a method for forming bumps on a semiconductor chip or printed circuit board (PCB). More particularly, the present invention relates to a method for forming multi-layer connectors for flip chip bonding using metal powders and an adhesive or a flux.

A typical flip chip assembly uses a direct electrical connection of a face-down semiconductor chip onto a substrate or circuit board via conductive bumps. Generally, a flip chip assembly is made in three stages, forming bumps on a chip, attaching the bumped chip to a board or substrate, and filling the space remaining under the bumped chip with an electrically non-conductive material.

The conductive bump has several functions in a flip chip assembly, such as providing an electrical connection between a semiconductor chip and a substrate, providing a thermal path to carry heat from the semiconductor chip to the substrate, and providing part of the mechanical mounting to the substrate. The bump also acts as a spacer for preventing electrical contact between the semiconductor chip and substrate conductors.

There are many conventional methods of forming such conductive bumps. One method includes forming a photoresist layer having openings aligned with bond pads on a wafer, applying a solder paste in the openings by screen printing, and then melting or reflowing the solder paste to form a bump. The openings may be formed by radiating and developing the photoresist.

One problem with this method is that a new photoresist layer is required for processing each wafer. Another problem is that the photoresist layer is removed with chemical solutions, which generates chemical wastes. Yet another problem is that bump standoff (bump height) depends on the thickness of the photoresist mask. To obtain a higher standoff, a thicker photoresist layer is required.

Unfortunately, if a low or fine pitch (bump spacing) is required, the maximum possible thickness of the photoresist layer is limited. In practice, the openings in the photoresist layer typically have a reverse conical shape, i.e., the openings taper towards a narrow end at the bond pads. Hence, there is a tradeoff between a high standoff and a low pitch.

Another method of forming bumps involves patterning a photoresist layer applied to a wafer to form bump sites and electroplating a solder alloy onto the bump sites. The photoresist layer is then removed before reflowing the solder alloy to form a sphere. While this electroplating method provides a low pitch, wet chemicals or plating bath solutions are required. Further, such chemical processes involve hazardous materials that must be carefully controlled.

In view of the foregoing, it would be desirable to have a method for forming bumps that is low cost and does not involve wet chemicals. In addition, it would be desirable to have a method that provides high standoff (bump height) and low or fine pitch.

BRIEF DESCRIPTION OF THE DRAWINGS

The present invention will be readily understood by the following detailed description in conjunction with the accompanying drawings. It will be apparent to those of skill in the art that certain features are not drawn to scale in order to facilitate a clear understanding of the invention. To facilitate this description, like reference numerals designate like structural elements.

DETAILED DESCRIPTION OF THE INVENTION

Methods for forming multi-layer bumps or connectors on a substrate in a semiconductor chip or printed circuit board (PCB) environment are provided. In the following description, numerous specific details are set forth in order to provide a thorough understanding of the present invention. It will be understood, however, to one skilled in the art, that the present invention may be practiced without some or all of these specific details. In other instances, well known process operations have not been described in detail to not unnecessarily obscure the present invention.

Figure 1:
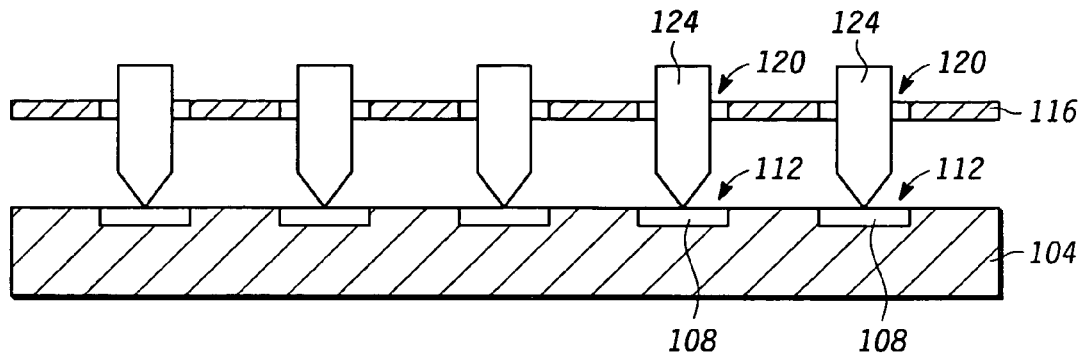
FIG. 1 is an enlarged cross-sectional view of a semiconductor wafer in accordance with a first embodiment of the present invention.

Referring now to FIG. 1, an enlarged, cross-sectional view of a semiconductor chip or wafer or PCB substrate 104 in accordance with one embodiment of the present invention is shown. The substrate 104 includes a number of bond pads 108 for defining bump sites 112 on which bumps may be formed. Before forming the bumps, the substrate 104 is cleaned to remove contaminants, such as aluminum oxide, from the bond pads 108.

To accomplish such cleaning, a masking plate 116 patterned with one or more apertures 120 is disposed over the substrate 104 such that the apertures 120 are aligned with the bump sites 112. A localized irradiation beam 124, such as, infrared or laser beam is provided over the masking plate 116 and directed at the bump sites 112. The beam 124 burns and removes contaminants from the pads 108.

The apertures 120 allow the irradiation beam 124 to pass through to the bump sites 112 while the masking plate 116 blocks the beam from irradiating the rest of the substrate 104. The masking plate 116 may be made of metal or ceramic materials, and may have a thickness of about 500 microns to about 1 millimeter. The apertures 120 may have diameters from about 40 microns to about 60 microns, to closely match the size of the bond pads 108.

Figure 2:
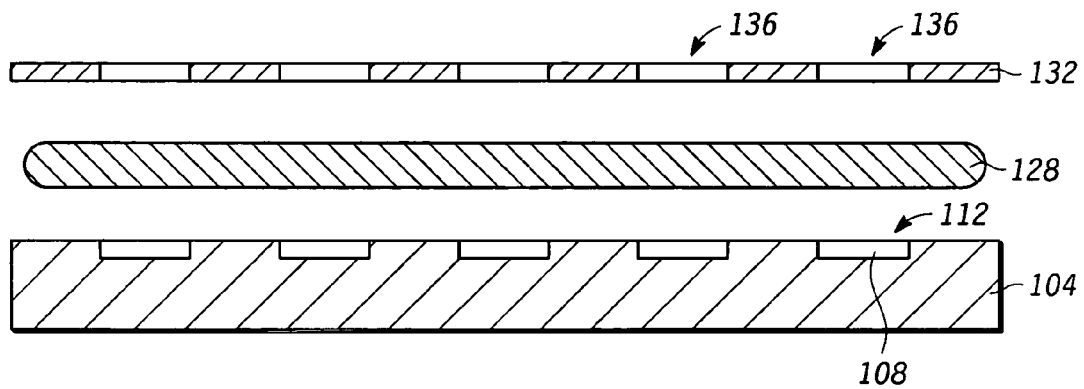
FIG. 2 is an enlarged cross-sectional view of the semiconductor wafer of FIG. 1 having a first metal powder in accordance with an embodiment of the present invention.

Referring now to FIG. 2, a cross-sectional view of the substrate 104 having a first metal powder 128 is shown. The first metal powder 128 is deposited over the substrate 104 to form a substantially uniform layer over the bump sites 112. A masking plate 132 with apertures 136 is disposed over the substrate 104 such that the apertures 136 on the masking plate 132 are aligned with the bump sites 112. The masking plate 132 can be the same as the masking plate 116 used to regulate the irradiation beam 124 as described in FIG. 1.

The first metal powder 128 may comprise copper or high lead solder and has a particle size of about 5 microns to about 10 microns. Though other particle sizes may also be used, it should be appreciated that larger particle sizes may result in larger bump sizes and bump pitch. The first metal powder 128 has a melting point of at least about 300 degrees Celsius.

Figure 3:
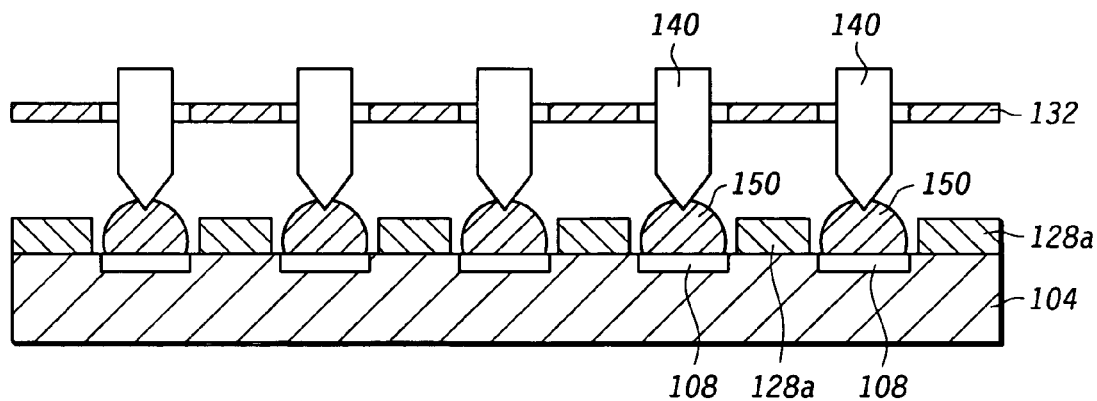
FIG. 3 is an enlarged cross-sectional view of the semiconductor wafer of FIG. 2 during a first irradiation of the first metal powder in accordance with an embodiment of the present invention.

Referring now to FIG. 3, a cross-sectional view of the substrate 104 during a first irradiation of the first metal powder 128 is shown. A first irradiation beam 140 is fired through the masking plate 132 (or 116), which directs the beam 140 at selected portions of the first metal powder 128 through the apertures 136 (or 120). The selected portions of the first metal powder 128 are thus melted or reflowed to form a number of first bumps 150 on the bond pads 108, while remaining portions 128a of the metal powder 128 are unmelted. The first irradiation beam 140 may be any type of beam suitable for heating and melting the first metal powder, such as an infrared beam or a laser beam that is easy to focus.

Figure 4:
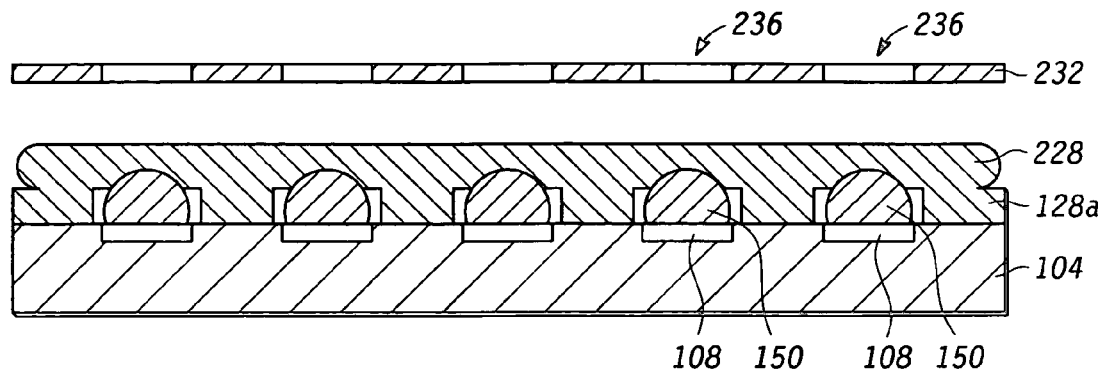
FIG. 4 is an enlarged cross-sectional view of the semiconductor wafer of FIG. 3 having a second metal powder over first bumps in accordance with an embodiment of the present invention.

Referring now to FIG. 4, a cross-sectional view of the substrate 104 having a second metal powder 228 disposed over the substrate 104 and the first bumps 150 is shown. The second metal powder 228, which preferably has a lower melting point than the first metal powder 128, is deposited over the first bumps 150. The melting point for the second metal powder 228 may range between about 150 degrees Celsius to about 200 degrees Celsius.

The second metal powder 228 may be a eutectic solder, tin-lead for example, having a particle size of about 5 microns to about 10 microns. However, it should be appreciated that a larger particle size may result in larger bump size and bump pitch. A masking plate 232 is disposed over the second metal powder 228 so that apertures 236 in the masking plate 232 are aligned with the first bumps 150 upon which second bumps 250 are to be formed. The masking plate 232 can be the same as the masking plate 116 as described in FIG. 1, or the masking plate 132 as described in FIG. 2, or both.

Figure 5:
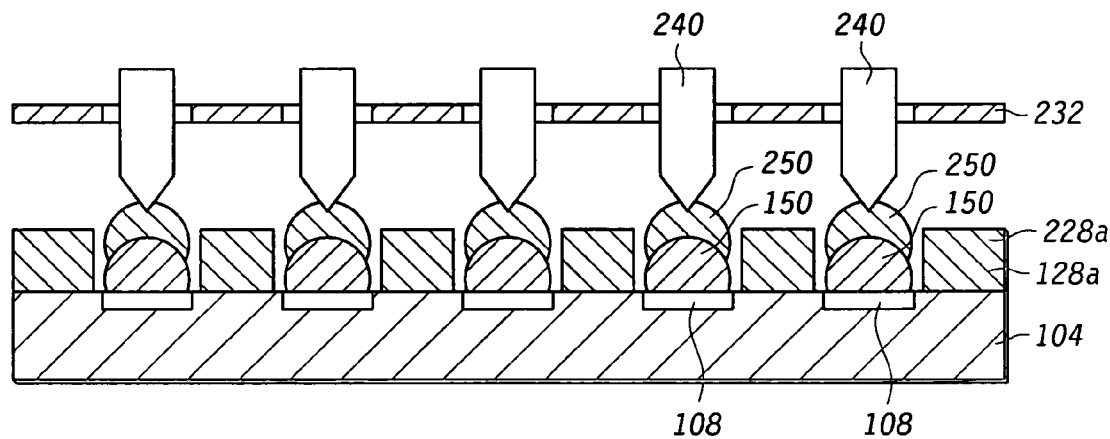
FIG. 5 is an enlarged cross-sectional view of the semiconductor wafer of FIG. 4 during a second irradiation of the second metal powder in accordance with an embodiment of the present invention.

Referring now to FIG. 5, a cross-sectional view of the substrate 104 during a second irradiation of the second metal powder 228 is shown. A second irradiation beam 240 is fired through the masking plate 232, which directs the irradiation beam 240 at selected portions of the second metal powder 228 through the apertures 236. The selected portions of the second metal powder 228 are thus melted or reflowed to form a number of second bumps 250 on the first bumps 150, while remaining portions 228a of the metal powder 228 are unmelted. Because the second metal powder 228 has a lower melting point than the first metal powder 128, the first bumps 150 do not melt when the second metal powder 228 is melted or reflowed to form the second set of bumps 250.

The second irradiation beam 240 may be an infrared beam or a laser beam, which heats the second metal powder 228 to a threshold at which it is sufficiently molten to bond with the first bumps 150. The second bumps 250 are then cooled and allowed to solidify. Finally, the unmelted portions of the first and second metal powders 128a and 228a are removed by, for example, air-blowing or spinning.

In another aspect of the present embodiment, bumps may be formed on a pad metallurgy, which is provided on the bond pads 108. The pad metallurgy, also known as under-bump metallization (UBM), protects the substrate 104 and provides an electrical and mechanical connection between the bumps and an external substrate, such as a printed circuit board (PCB). The UBM generally comprises successive layers of metal formed on bond pads 108 by methods known to a person skilled in the art.

In yet another aspect, the irradiation beam for melting or reflowing the metal powders 128, 228 and for cleaning the bump sites 112 may be replaced with a programmable single laser beam. With the programmable single laser beam, heat for melting the metal powders 128, 228 can be more precisely directed at the bump sites 112. Hence, portions of the metal powders 128, 228 for forming the bumps 150, 250 can be selectively melted without necessarily requiring a masking plate to regulate heat exposure.

Figure 6:
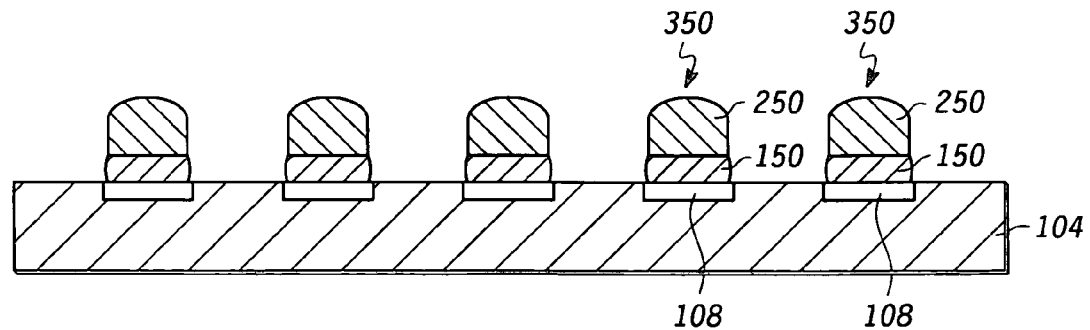
FIG. 6 is an enlarged cross-sectional view of a number of binal-layer metallic bumps formed on bond pads of a semiconductor wafer in accordance with an embodiment of the present invention.

Referring now to FIG. 6, a cross-sectional view of a number of binal-layer metallic bumps 350 formed on the bond pads 108 of the substrate 104 in accordance with one embodiment of the present invention is shown. Each binal-layer bump 350 includes a first bump 150 coupled to the bond pad 108, and a second bump 250 formed upon and coupled to the first bump 150. In a flip chip assembly, for example, the binal-layer bumps 350 provide connectors for electrically connecting the semiconductor substrate 104 to an external substrate in an electronic package. Generally, the first bump 150 provides standoff while the second bump 250 provides solder joint formation.

One of the main advantages of the embodiment of the present invention described above is that processing costs may be greatly reduced since it requires minimal tooling. In addition, the embodiment involves no wet chemical processes, and utilizes a reusable masking plate. The masking plate may be eliminated if a programmable, single laser beam is used to selectively melt the metal powders.

Another advantage of the present invention is the high standoff that can be achieved by binal or multi-layer bumps as compared with single-layer bumps. At high temperatures, the silicon wafer and bumps are subject to thermal-mechanical stress caused by different expansion rates in the silicon wafer and an external surface, such as PCB. The differing rates of expansion are due to coefficients of thermal expansion (CTE) mismatch in the different materials. Excessive stress may cause silicon fracture or bump fracture. A high standoff releases the stress caused by CTE mismatch and thereby improves bump joint reliability.

A further advantage of the present invention is reduced bump size and bump pitch. By forming the second bump 250 on the first bump 150, a high standoff is achieved without increasing bump size or diameter. This, in turn, allows a lower or finer bump pitch ranging from about 50 microns to about 75 microns depending on the metal powder particle size used and resolution of the apertures of the masking plate. When a programmable laser beam is used, bump size and pitch depend on the resolution of the laser beam.

Figure 7:
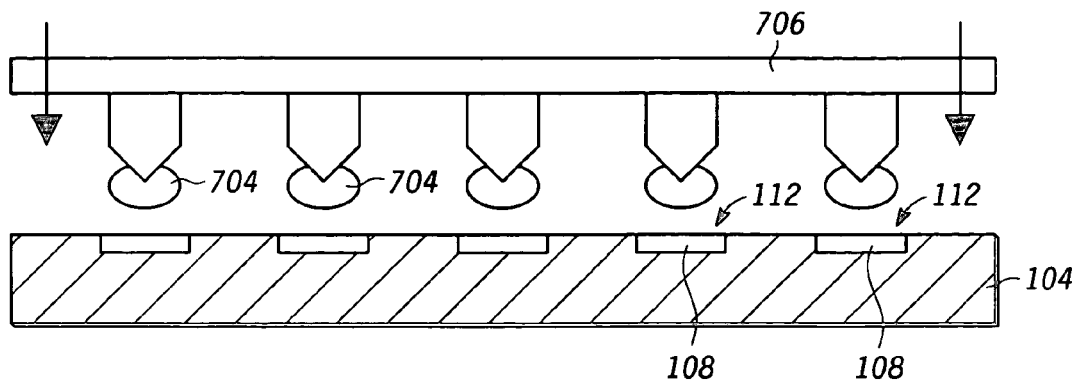
FIG. 7 is an enlarged cross-sectional view of a semiconductor wafer receiving an adhesive or a flux in accordance with a second embodiment of the present invention.

Referring now to FIG. 7, a cross-sectional view of a semiconductor chip or wafer or PCB substrate 104 in accordance with another embodiment of the present invention is shown. The substrate 104 includes a number of bond pads 108 for defining bump sites 112 on which bumps may be formed. The size of the bond pads 108 may be between about 40 microns to about 60 microns.

A first adhesive 704 is deposited onto the bond pads 108 of the substrate 104 by a dispensing tool 706. The adhesive 704 should preferably overlay about the entire bond pad surface and may have a thickness of about 30 microns on the bond pad. Suitable adhesives may include a flux, such as, tin-lead solder flux, water soluble flux and no-clean flux. It should be appreciated that flux improves wetting abilities of the metallic powders and enhances amalgamation of the metallic powders. In addition, flux may be used to remove contaminants and oxidation from the surface of the bond pads 108. Therefore, cleaning of the bond pads 108 is not required before forming the bumps.

It should also be appreciated that water soluble flux may comprise organic acids, thixotrope and a solvent. It should be further appreciated that no-clean flux may comprise resin, a solvent and an activator. The adhesive or flux 704 is preferably in liquid or molten form when it is deposited onto the substrate 104. The boiling point of the adhesive 704 may range between about 150 degrees Celsius to about 170 degrees Celsius to ensure that most of the adhesive contents evaporate when the substrate 104 is subsequently subject to a reflow process.

There are various methods to deposit an adhesive or a flux onto a substrate 104. One method is by ink-jet printing the adhesive onto the substrate 104. Ink-jet printing methods may achieve a minimum dot size of about 5 microns. One example of ink-jet printing technology operates on a thermal drop-on-demand method. This method involves propelling droplets of ink through a nozzle by the growth and collapse of a vapor bubble caused by heating a resistor located near the nozzle. Another example of ink-jet printing technology operates on a continuous ink-jet method. This method involves a piezoelectric crystal for producing a continuous stream of ink droplets. Charged droplets are deposited on a receiving media while uncharged droplets are deflected into a gutter for recirculation.

Another method of depositing adhesive or flux onto the substrate 104 is by pin transfer. In this method, an array of pins is patterned to according to the arrangement of the bond pads 108. The array of pins is first dipped into a reservoir of adhesive to coat the pin with adhesive. The adhesive-coated pins are then pressed against the substrate 104 to dispense an appropriate amount of adhesive from the pins onto the bond pads 108 of the substrate 104.

Figure 8:
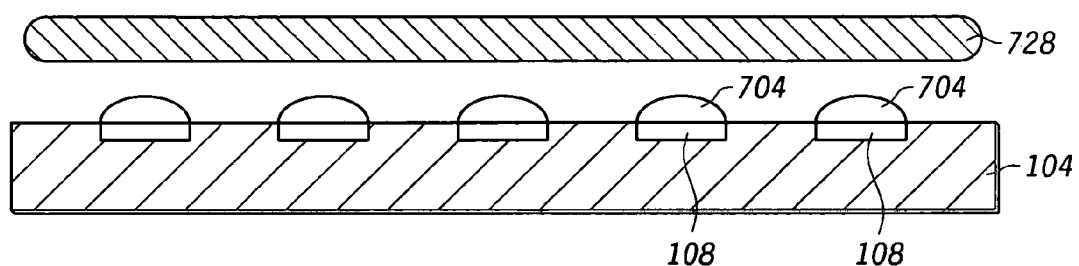
FIG. 8 is an enlarged cross-sectional view of the semiconductor wafer of FIG. 7 having a first metal powder in accordance with an embodiment of the present invention.

Referring now to FIG. 8, a cross-sectional view of the semiconductor wafer of FIG. 7 having a first metal powder 728 in accordance with an embodiment of the present invention is shown. The first metal powder 728 is deposited over the adhesive 704 on the bond pads 108. The thickness of the first metal powder 728 layer may be varied to match the desired height of the bumps to be formed and may be, for example, about 50 microns. Portions of the first metal powder 728 overlaying the adhesive 704 then adhere to the adhesive 704. Excess first metal powder 728 that does not adhere may be removed by air blowing or flipping the substrate 104.

The first metal powder 728 preferably comprises high lead solder and has a particle size of about 5 microns to about 10 microns. Though other particle sizes may also be used, it should be appreciated that larger particle sizes may result in larger bump sizes and bump pitch. The metal powder chosen as the first metal powder 728 may have a melting point in the range of about 300 degrees Celsius to about 350 degrees Celsius.

Figure 9:
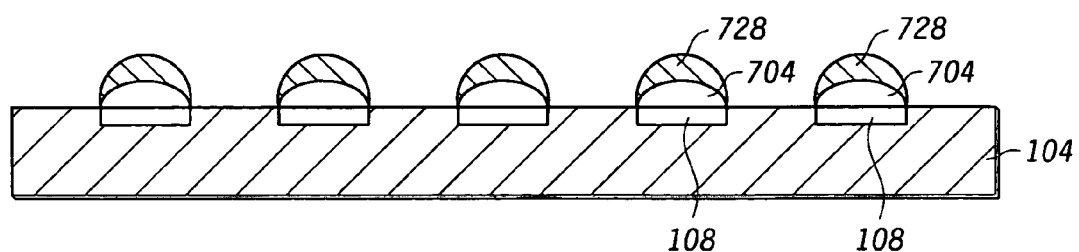
FIG. 9 is an enlarged cross-sectional view of the semiconductor wafer of FIG. 8 having the first metal powder adhered to the deposited adhesive in accordance with an embodiment of the present invention.

Referring now to FIG. 9, a cross-sectional view of the semiconductor wafer of FIG. 8 having the first metal powder 728 adhered to the deposited adhesive 704 in accordance with an embodiment of the present invention is shown. After excess first metal powder 728 is removed, a sufficient amount of the first metal powder 728 still adheres to the adhesive 704 on the bond pads 108.

A reflow process is then carried out to heat the first metal powder 728 and the first adhesive 704 to form first bumps 750. More specifically, the substrate 104, the flux 704, and the first metal powder 728 are heated to between about 300 degrees Celsius to about 350 degrees Celsius until the first metal powder 728 melts and bonds onto the bond pads 108 to form the first bumps 750. During the reflow, most of the adhesive contents are evaporated.

Figure 10:
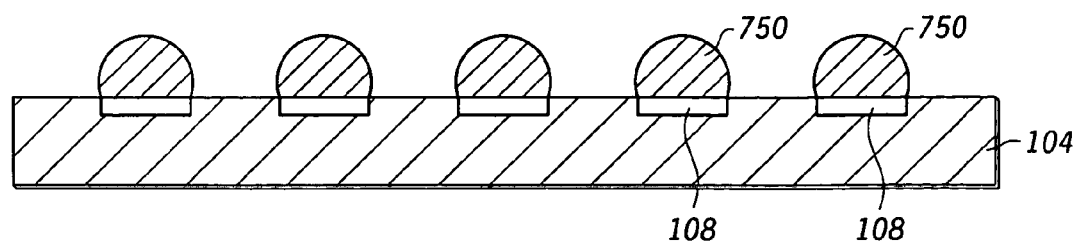
FIG. 10 is an enlarged cross-sectional view of the semiconductor wafer of FIG. 9 having first bumps formed thereon in accordance with an embodiment of the present invention.

Referring now to FIG. 10, a cross-sectional view of the semiconductor wafer of FIG. 9 having the first bumps 750 formed thereon in accordance with an embodiment of the present invention is shown. It should be appreciated that the first bumps 750 formed on the wafer substrate 104 may not have uniform dimensions because removal of excess first metal powder 728 from the wafer substrate 104 may cause uneven amounts of the first metal powder 728 to remain adhered to the adhesive 704.

Figure 11:
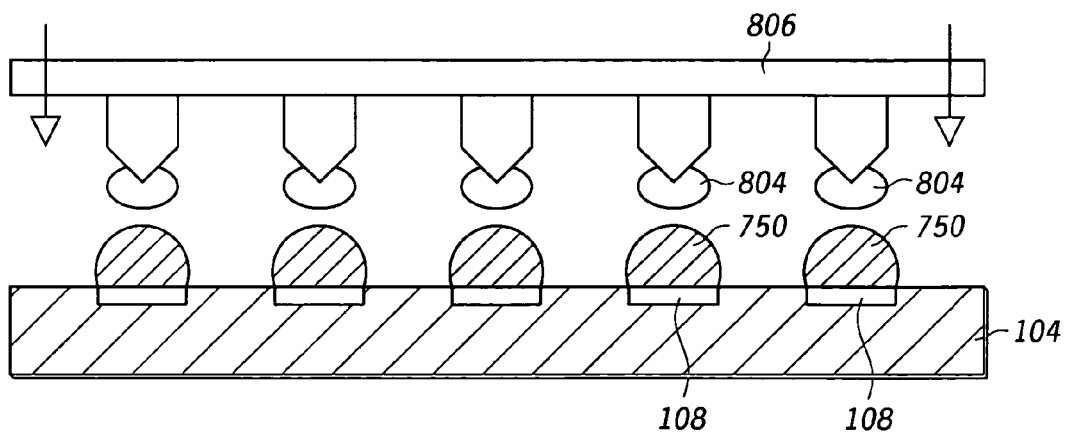
FIG. 11 is an enlarged cross-sectional view of the semiconductor wafer of FIG. 10 receiving an adhesive on the first bumps in accordance with an embodiment of the present invention.

When the first bumps 750 are cooled, a second layer of bumps can be formed on the first bumps 750. Referring now to FIG. 11, a cross-sectional view of the semiconductor wafer of FIG. 10 receiving an adhesive on the first bumps 750 in accordance with an embodiment of the present invention is shown.

A second adhesive 804 is deposited onto the bump sites 112 on the substrate 104 by a dispensing tool 806. The second adhesive 804 may be the same or different from the first adhesive 704. The second adhesive 804 is preferably in liquid or molten form when it is deposited onto the substrate 104 and may form a thickness of about 30 microns on the first bumps 750. The boiling point of the second adhesive 804 ranges between about 150 degrees Celsius to about 170 degrees Celsius. The second adhesive 804 may be deposited by one of the methods described above for depositing the first adhesive 704.

Figure 12:
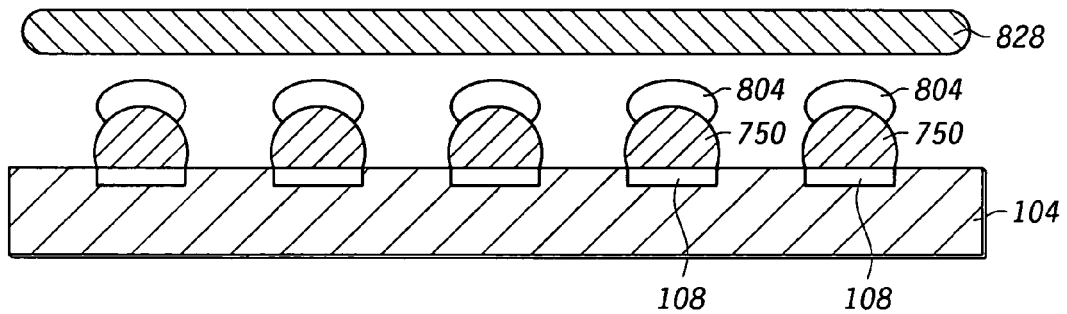
FIG. 12 is an enlarged cross-sectional view of the semiconductor wafer of FIG. 11 receiving a second metal powder in accordance with the second embodiment of the present invention.

Referring now to FIG. 12, a cross-sectional view of the semiconductor wafer of FIG. 11 having a second metal powder 828 in accordance with an embodiment of the present invention is shown. The second metal powder 828, which preferably has a lower melting point than the first metal powder 728, is deposited over the second adhesive 804. The melting point for the second metal powder 828 ranges between about 150 degrees Celsius to about 200 degrees Celsius. The thickness of the second metal powder 828 layer depends on the desired height of the second bumps 850 formed and may be about 50 microns. Portions of the second metal powder 828 overlaying the second adhesive 804 then adhere to the second adhesive 804. Excess second metal powder 828 that is not adhered to the second adhesive 804 is removed by air blowing or flipping the substrate 104.

The second metal powder 828 preferably comprises a eutectic solder and has a particle size of about 5 microns to about 10 microns. Though other particle sizes may also be used, it should be appreciated that larger particle sizes may result in larger bump sizes and bump pitch.

Figure 13:
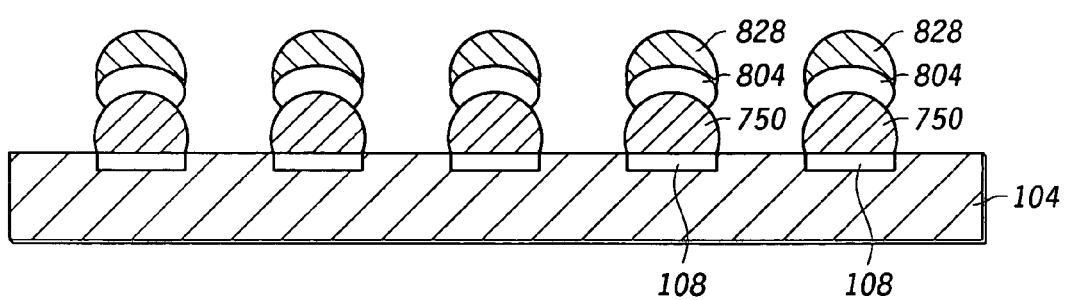
FIG. 13 is an enlarged cross-sectional view of the semiconductor wafer of FIG. 12 having the second metal powder adhered to the deposited adhesive in accordance with an embodiment of the present invention.

Referring now to FIG. 13, a cross-sectional view of the semiconductor wafer of FIG. 12 having the second metal powder 828 adhered to the second adhesive 804 in accordance with an embodiment of the present invention is shown. After excess second metal powder 828 is removed, a sufficient amount of the second metal powder 828 still adheres to the adhesive 804 on the bond pads 108.

Figure 14:
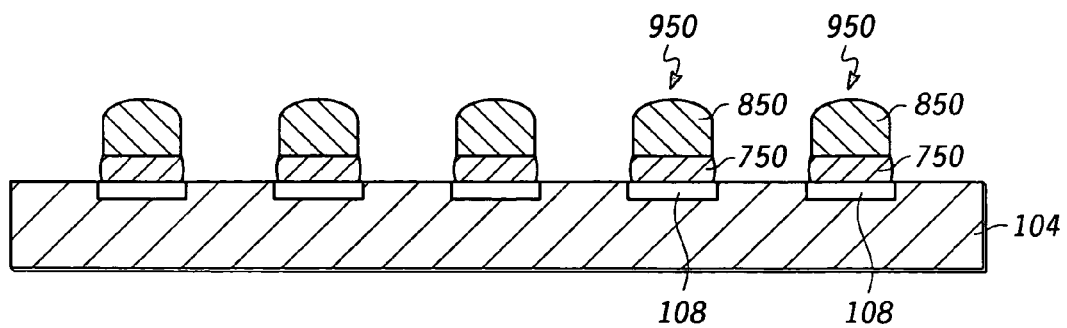
FIG. 14 is an enlarged cross-sectional view of the semiconductor wafer of FIG. 13 having second bumps formed on the first bumps in accordance with an embodiment of the present invention.

A reflow process is then carried out to heat the second metal powder 828 and the flux 804 to form second bumps 850 (FIG. 14). More particularly, the substrate 104, the flux 804, and the first metal powder 728 are heated until the second metal powder 828 melts and is bonded onto the first bumps 750 to form the second bumps 850. The heating temperature is controlled at below the melting point of the first metal powder 728 so that the first bumps 750 do not melt during the reflow process to form the second bumps 850. During the reflow, most of the adhesive or flux contents are evaporated.

Referring now to FIG. 14, a cross-sectional view of the semiconductor wafer of FIG. 13 having binal-layer bumps 950 in accordance with an embodiment of the present invention is shown. It should be appreciated that the second bumps 850 formed on the wafer substrate 104 may not have uniform bump height dimensions because removal of excess second metal powder 828 from the wafer substrate 104 may cause uneven amounts of the second metal powder 828 to remain adhered to the adhesive 804. To achieve the desired shape, the binal-layer bumps 950 may be coined into a predetermined form factor.

In this embodiment of the present invention, the first adhesive 704 and the second adhesive 804 used may have different or identical compositions. Using the same flux (i.e. identical compositions) for forming both first and second bumps 850 has an advantage of simplifying the bump-forming process.

The present embodiment is particularly advantageous to reduce processing costs since it requires minimal tooling and involves no wet chemical processes. Another advantage of the present embodiment is the high standoff that can be achieved by binal or multi-layer bumps as compared with single-layer bumps. As described above, a high standoff releases the stress caused by coefficients of thermal expansion (CTE) mismatch in different material and thereby improves bump joint reliability.

A further advantage of the present embodiment is reduced bump size and bump pitch. By forming the second bump 850 on the first bump 750, a high standoff is achieved without increasing bump size or diameter. This, in turn, allows a lower or finer bump pitch of about 100 microns depending on the metal powder particle size used.

While the above processes are described in relation to forming bumps on a substrate 104, the present invention is applicable to forming interconnects or bumps on PCB substrates. The above process is also applicable to forming a connector having more than the two layers of bumps. For example, a third bump of the connector can be formed by depositing a third metal powder over the second bump 250, and selectively melting or reflowing a portion of the third metal powder. Alternatively, a third bump of the connector can be formed by depositing a third metal powder and an adhesive over the second bump 850, and reflowing to form a third bump on the second bump 850.

Other embodiments of the invention will be apparent to those skilled in the art from consideration of the specification and practice of the invention. Furthermore, certain terminology has been used for the purposes of descriptive clarity, and not to limit the present invention. The embodiments and preferred features described above should be considered exemplary, with the invention being defined by the appended claims.

The invention claimed is:

1. A method for forming a bump on a substrate, comprising:
   depositing a first adhesive on the substrate by inkjet printing;
   depositing a first metal powder on the first adhesive, wherein the first metal powder adheres to the first adhesive;
   heating the first adhesive and the first metal powder to form a first bump on the substrate;
   depositing a second adhesive on the first bump;
   depositing a second metal powder on the second adhesive, wherein the second metal powder adheres to the second adhesive; and
   heating the second adhesive and the second metal powder to form a second bump on the first bump.

2. The method for forming a bump on a substrate according to claim 1, wherein a melting point of the second metal powder is lower than a melting point of the first metal powder.

3. The method for forming a bump on a substrate according to claim 2, further comprising coining the first bump and the second bump into a predetermined form factor.

4. The method for forming a bump on a substrate according to claim 2, wherein the first metal powder and the second metal powder each have a particle size between about 5 microns to about 10 microns.

5. The method for forming a bump on a substrate according to claim 4, wherein the first metal powder comprises high lead solder and the second metal powder comprises eutectic solder.

6. The method for forming a bump on a substrate according to claim 1, wherein heating the second adhesive and the second metal powder further comprises evaporating the second adhesive.

7. The method for forming a bump on a substrate according to claim 1, wherein heating the first adhesive and the first metal powder further comprises evaporating the first adhesive.

8. A method for forming a bump on a substrate, comprising:
   depositing a first adhesive on the substrate by:
      providing a reservoir of the first adhesive;
      dipping a pin into the reservoir to coat the pin with the first adhesive; and
      dispensing the first adhesive onto the substrate via the pin;
   depositing a first metal powder on the first adhesive, wherein the first metal powder adheres to the first adhesive; and
   heating the first adhesive and the first metal powder to form a first bump on the substrate.

9. The method for forming a bump on a substrate according to claim 1, further comprising removing an unadhered portion of the first metal powder prior to heating the first adhesive and the first metal powder.

10. The method for forming a bump on a substrate according to claim 9, wherein the first adhesive comprises one of tin-lead solder flux, water soluble flux, and no-clean flux.

11. The method for forming a bump on a substrate according to claim 9, wherein the first adhesive and the first metal powder are heated to a temperature of between about 300 degrees Celsius to about 350 degrees Celsius.

12. A method for forming a multi-layer connector on a substrate, comprising:
   depositing a first adhesive and a first metal powder on the substrate, wherein the first adhesive is deposited on the substrate by inkjet printing;
   heating the first adhesive and the first metal powder to form a first bump;
   depositing a second adhesive and a second metal powder over the first bump; and
   heating the second adhesive and the second metal powder to form a second bump on the first bump, wherein the first bump and the second bump form the multi-layer connector.

13. The method for forming a multi-layer connector on a substrate according to claim 12, wherein a melting point of the second metal powder is lower than a melting point of the first metal powder.

14. The method for forming a multi-layer connector on a substrate according to claim 12, further comprising coining the multi-layer connector into a predetermined form factor.

15. The method for forming a multi-layer connector on a substrate according to claim 12, wherein heating the first adhesive and the first metal powder further comprises evaporating the first adhesive, and heating the second adhesive and the second metal powder further comprises evaporating the second adhesive.

16. The method for forming a multi-layer connector on a substrate according to claim 12, further comprising removing an unadhered portion of the first metal powder prior to heating the first adhesive and the first metal powder.

17. The method for forming a multi-layer connector on a substrate according to claim 12, wherein the first adhesive and the second adhesive comprise a flux.

18. The method for forming a multi-layer connector on a substrate according to claim 12, wherein the first metal powder and the second metal powder each have a particle size between about 5 microns to about 10 microns.

* * * * *